(12) United States Patent
Mathes et al.

(10) Patent No.: US 7,791,862 B2
(45) Date of Patent: Sep. 7, 2010

(54) ELECTRICAL SWITCHGEAR ASSEMBLY AND BASIC MODULE FOR AN ELECTRICAL SWITCHGEAR ASSEMBLY

(75) Inventors: Werner Mathes, Frankenthal (DE); Klaus Kraft, Heidelberg (DE); Hans-Juergen Schmitt, Hirschberg (DE)

(73) Assignee: ABB AG, Mannheim (DE)

( * ) Notice: Subject to any disclaimer, the term of this patent is extended or adjusted under 35 U.S.C. 154(b) by 0 days.

(21) Appl. No.: 11/910,469

(22) PCT Filed: Mar. 25, 2006

(86) PCT No.: PCT/EP2006/002766

§ 371 (c)(1),
(2), (4) Date: Nov. 19, 2007

(87) PCT Pub. No.: WO2006/105883

PCT Pub. Date: Oct. 12, 2006

(65) Prior Publication Data

US 2008/0144258 A1    Jun. 19, 2008

(30) Foreign Application Priority Data

Apr. 8, 2005    (DE) .................... 10 2005 016 543

(51) Int. Cl.
*H02B 1/26*    (2006.01)

(52) U.S. Cl. .................. 361/608; 361/614; 361/622; 361/636; 200/50.21; 200/50.32

(58) Field of Classification Search ......... 361/600–612, 361/621–625, 641–648, 93.3, 725–729, 832, 361/62, 71; 200/50.21–50.26, 50.32, 400; 324/105; 218/118, 123, 140, 153, 155

See application file for complete search history.

(56) References Cited

U.S. PATENT DOCUMENTS

| 3,470,422 | A | * | 9/1969 | Lameyre et al. | ............. 361/608 |
| 5,095,403 | A | * | 3/1992 | Pin et al. | ................... 361/641 |
| 5,638,051 | A | * | 6/1997 | Kutzer | ....................... 340/635 |
| 5,691,686 | A | | 11/1997 | Ishikawa et al. | |
| 6,639,775 | B1 | | 10/2003 | Musiol et al. | |

FOREIGN PATENT DOCUMENTS

| DE | 25 15 164 (A1) | 10/1976 |
| DE | 32 43 060 (A1) | 5/1984 |
| DE | 32 43 127 (A1) | 5/1984 |
| DE | 32 43 130 (A1) | 5/1984 |

(Continued)

OTHER PUBLICATIONS

Scan 12142009_130807, which is English translation of the German reference by Behla et al (DE19516327C).*

(Continued)

*Primary Examiner*—Michael V Datskovskiy
(74) *Attorney, Agent, or Firm*—Buchanan Ingersoll & Rooney PC

(57) ABSTRACT

The invention relates to an electric switching system which comprises a housing and components which are arranged therein and which are embodied as a control and/or measuring unit. Said components are arranged in modular-type drawers. At least one base module comprises at least one module support profile, in addition to lateral walls and front-sided insertion elements. One front wall of the base module, preferably the front side thereof, is formed by a control unit and the opposite front wall thereof of the measuring unit, and the dimensions of the control and measuring unit are adapted to the size of the module.

26 Claims, 2 Drawing Sheets

FOREIGN PATENT DOCUMENTS

| | | |
|---|---|---|
| DE | 3243127 A * | 5/1984 |
| DE | 33 28 785 (A1) | 2/1985 |
| DE | 42 10 679 (A1) | 10/1993 |
| DE | 92 12 151 (U1) | 3/1994 |
| DE | 19516327 C1 * | 7/1996 |
| DE | 195 11 648 (A1) | 10/1996 |
| DE | 195 23 592 (A1) | 1/1997 |
| DE | 29514997 U1 * | 1/1997 |
| DE | 197 06 019 (A1) | 8/1998 |
| DE | 198 45 799 (A1) | 4/2000 |
| DE | 10007007 A1 * | 9/2001 |
| EP | 0 109 569 (A2) | 5/1984 |
| EP | 0 109 584 (A2) | 5/1984 |
| JP | 58015411 A * | 1/1983 |
| JP | 03155313 A * | 7/1991 |

OTHER PUBLICATIONS

Form PCT/ISA/210 (International Search Report) dated Nov. 28, 2006.

German Search Report dated Jul. 10, 2007 (with English translation of category of cited documents).

Machine translation of EP0109569 generated Apr. 8, 2009 by http://epo.worldlingo.com/.

Machine translation of DE10007007 generated Apr. 8, 2009 by http://epo.worldlingo.com/.

Machine translation of DE3243127 generated Apr. 8, 2009 by http://epo.worldlingo.com/.

* cited by examiner

ELECTRICAL SWITCHGEAR ASSEMBLY AND BASIC MODULE FOR AN ELECTRICAL SWITCHGEAR ASSEMBLY

The invention relates to an electrical switchgear assembly having a housing and components which are arranged therein and are in the form of a control and/or measuring unit, the components being arranged in modular withdrawable parts, and to a basic module for such a switchgear assembly.

Electrical switchgear assemblies of today's design are predominantly designed using so-called withdrawable part technology, i.e. all of the electrical operating means and devices, for example the control and measuring devices installed as components, are arranged on preferably modularized withdrawable parts.

On the one hand this has the advantage of simplified accessibility by virtue of the fact that, if required, for example in the event of a fault, the withdrawable module in question can be removed easily from the respective housing and therefore repaired, exchanged or replaced without any considerable dismantling work.

On the other hand, the known modularized withdrawable part technology has the disadvantage of requiring a large amount of space since the size of the withdrawable modules usually comes down to the size of the largest component intended to be inserted, with the result that, owing to the smaller size of other components, often unrequired space remains unused in the switchgear cabinets or the switchgear assemblies need to be dimensioned unnecessarily large.

On the basis of this prior art, the object of the invention is to provide an electrical switchgear assembly as well as a corresponding basic module for such an assembly of the type mentioned at the outset which can be produced easily and furthermore ensure utilization of space which is as effective as possible.

This object is achieved according to the invention by the characterizing features of the independent claims. Accordingly, at least one basic module is provided which has a module bearing profile, which is formed by a base bearing rail, as well as end-side and lateral walls, one end wall of the basic module, preferably its front side, being formed by a control unit and its opposite end wall being formed by a measuring unit, and the dimensions of the control and measuring units being matched to the module dimensions.

With the aid of this module technology, which, according to the invention, can be matched to the respective size requirements, it is now possible to make best possible use of the space available in the switchgear cabinet in question. This advantage is reinforced by the fact that all of the driving, measuring and signaling functions are integrated in the basic module.

Improved utilization of space is also based on the fact that, in accordance with an advantageous configuration of the invention, each basic module is held in the housing by means of rails, which are integrally formed on both sides of the module bearing profile.

In this case, provision is advantageously made for guide grooves formed on the module bearing profile and associated rails in the housing to interact and, as a result, the basic module is guided on both sides in the device area, which is provided as a switchpanel, in the housing, in accordance with an expedient development of the invention the module bearing profile being provided with latching and holding grooves.

A further embodiment of the invention provides that the two longitudinal walls of the basic module are formed by two partition walls which can be latched in.

In this case, it has proven to be favorable with regard to the desired effective utilization of space that the side walls engage in the latching and holding grooves, which are integrated in each module bearing profile, and form a module housing.

Within the sense of improved handling of the above-described electrical switchgear assembly designed according to the invention, a latching ball and/or locking disk is provided which is integrated in the module bearing profile and, by means of latching into a base bearing rail of the housing, thereby jointly forms a defined position.

An advantageous feature of this design has proven to be the fact that the withdrawable-part locking means formed by means of the locking disk or latching ball, the module bearing profile and the cutout in the base plate in conjunction with the respective module front is safe from arcing faults.

Likewise in order to improve handling of the respective module of the electrical switchgear assembly according to the invention, a module grip, which makes it possible to pull and push the basic module in question in the switchpanel, is arranged on the front end side of each basic module.

These and further advantageous configurations and improvements of the invention are the subject matter of the dependent claims.

The invention, advantageous configurations and improvements of the invention and particular advantages of the invention will be explained and described in more detail with reference to an exemplary embodiment of the invention illustrated in the attached drawing, in which:

FIG. 1 shows a basic withdrawable module 10 with an exemplary configuration, in an exploded illustration.

Figure 1:
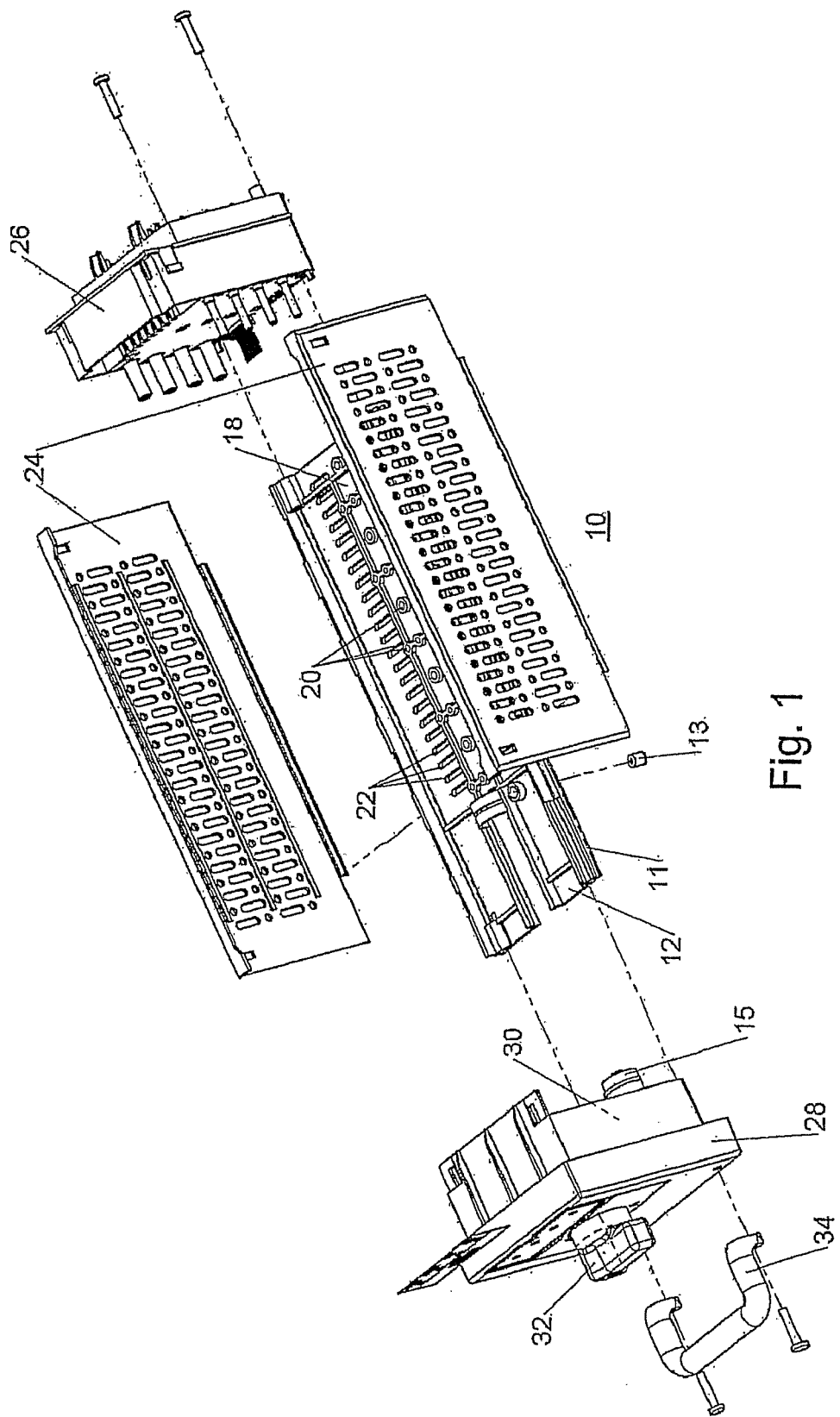
FIG. 1 shows an exploded illustration of a basic withdrawable module with an exemplary configuration.
Figure 2:
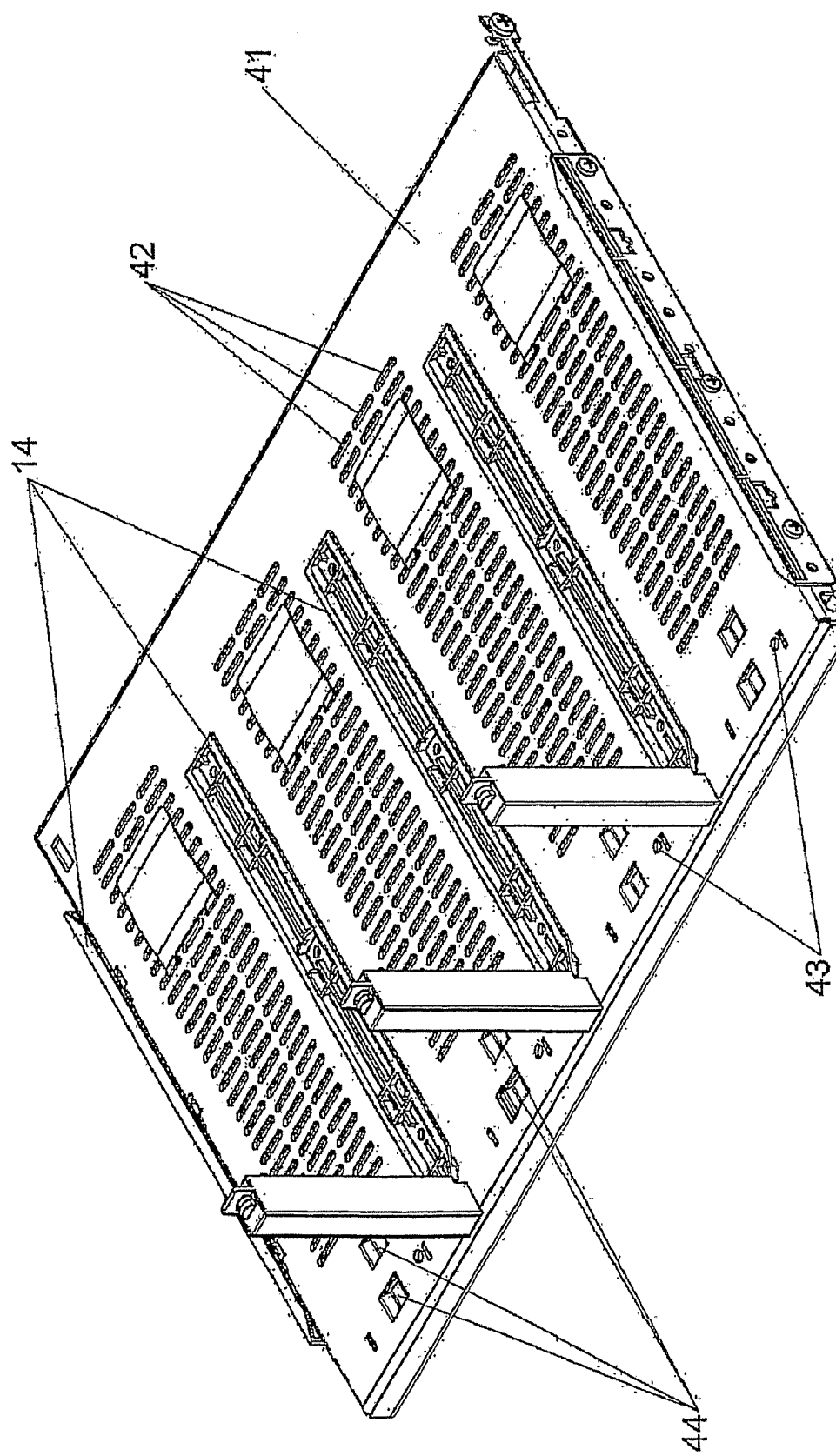
FIG. 2 shows a base plate with an exemplary configuration.

This basic module 10 has a module bearing profile 12 with guide grooves 11 which is guided safely by two rails 14, which are arranged parallel to one another, on the base plate 41 (see FIG. 2).

The module bearing profile 12, which can be produced, for example, from sheet metal, cast aluminum or else plastic, is provided with a groove-like depression 18, which is molded in along the center and into which circular cutouts 20 are formed at regular intervals, which cutouts are suitable, for example, for fastening and fixing, in an interlocking manner, further components and/or internals, which are not shown in any more detail here. Arranged on both sides of this depression along the center are, orthogonal thereto, slots 22 of the same length and width at a defined distance from one another and from the edge.

These slots 22 are provided in order to ensure optimum ventilation and cooling of the basic module or its internals. They correspond to the slots 42 (see FIG. 2) in the respective base plate 41 (see FIG. 2).

Provided in the module bearing profile 12 is a receptacle for a latching element 13, which is referred to as a latching ball and, in interaction with corresponding cutouts 43 in the respective base plate 41 (see FIG. 2), ensures a defined positioning of the basic module in relation to the base plate.

Provided on the longitudinal sides of the module bearing profile 12 are side walls 24, which are provided with openings and likewise adjoin the module bearing profile 12 in an interlocking manner.

A terminating part 26 in the form of a module rear wall is used on the rear end side of the basic withdrawable module 10 and, for its part, is connected in an interlocking manner to the module bearing profile 12 as well as to the side walls 24. In this case, a measuring device, in particular a measuring device having means for measured-variable detection and/or measured-variable preprocessing, are advantageously integrated in the terminating part.

The front end side is formed by a front module 28, which is likewise connected in an interlocking manner to the module bearing profile 12 as well as to the side walls 24. In the exemplary embodiment shown, the front module 28 is provided with a control device 30. A toggle switch 32 is used to switch over between different operating states of the basic module, to switch a switching device located in the interior of the module and to actuate the locking disk 15. The locking disk 15, the module bearing profile 12 and the cutouts 44 in the base plate 41 (cf. FIG. 2) interact with one another and ensure that the basic module 10 latches in the respective device area of the switchgear assembly, for example a switchgear cabinet, in a manner which is safe from arcing faults.

A handle 34, which is screwed onto the front module 28, is used to handle the basic withdrawable module 10.

FIG. 2 shows a perspective illustration of a base plate 41 with rails 14, which are arranged parallel to one another, for guiding the basic withdrawable module 10 or the guide grooves 11 of the module bearing profile.

Furthermore, the cutouts 43 in the base plate 41 are shown which, in interaction with the latching element 13, bring about a defined positioning of the basic module in relation to the base plate.

The cutouts 44 in the base plate 41, which interact with the locking disk 15 and the module bearing profile 12 and ensure that the basic module 10 latches in the respective device area of the switchgear assembly, for example a switchgear cabinet, in a manner which is safe from arcing faults, are also shown.

The invention claimed is:

1. An electrical switchgear assembly having a housing and components, the components being arranged in modular withdrawable parts in the housing,
   wherein at least one basic module is provided having at least one module bearing profile, lateral walls, a first end wall, and a second end wall,
   wherein the first end wall of the basic module constitutes a control unit,
   wherein the second end wall is arranged opposite to the first end wall and constitutes a measuring unit, and
   wherein dimensions of the control and measuring units are matched to dimensions of the module.

2. The electrical switchgear assembly as claimed in claim 1, wherein each basic module is held in the housing by means of rails respectively associated therewith, which are parallel to one another and belong to the module bearing profile.

3. The electrical switchgear assembly as claimed in claim 1, wherein guide grooves, which belong to the module bearing profile, are configured to interact with associated rails on a base plate and, the basic module is configured to be guided on two sides in an area in the housing.

4. The electrical switchgear assembly as claimed in claim 1, wherein the module bearing profile is provided with circular cutouts and slots.

5. The electrical switchgear assembly as claimed in claim 1, wherein the lateral walls of the basic module are formed by two partition walls which are configured to be latched in.

6. The electrical switchgear assembly as claimed in claim 1, wherein the lateral walls are configured to interact with holding grooves provided in each module bearing profile, and the lateral walls form a module housing.

7. The electrical switchgear assembly as claimed in claim 1, wherein a latching ball is provided as a holding element for a defined position of the basic module and is configured to interact with the module bearing profile and the corresponding cutouts of a base plate.

8. The electrical switchgear assembly as claimed in claim 1, wherein a locking disk, by being latched into a cutout in a base plate of the housing, forms at least part of a withdrawable-part locking mechanism.

9. The electrical switchgear assembly as claimed in claim 8, wherein the withdrawable-part locking mechanism formed by the locking disk, the module bearing profile, and the base plate are configured to interact in a manner which is safe from arcing faults.

10. The electrical switchgear assembly as claimed in claim 1, wherein a module grip, which is configured to position the basic module in the switchgear assembly, is arranged on a front end side of each basic module.

11. The electrical switchgear assembly as claimed in claim 1, wherein driving, measuring and signaling functions are integrated in the basic module.

12. A basic module for an electrical switchgear assembly, comprising:
   a module bearing profile;
   lateral walls;
   a first end wall; and
   a second end wall,
   wherein the first end wall of the basic module constitutes a control unit, and
   wherein the second end wall is arranged opposite to the first end wall and constitutes a measuring unit.

13. The electrical switchgear assembly as claimed in claim 2, wherein guide grooves, which belong to the module bearing profile, are configured to interact with associated rails on a base plate and, the basic module is configured to be guided on two sides in an area in the housing.

14. The electrical switchgear assembly as claimed in claim 2, wherein the module bearing profile is provided with circular cutouts and slots.

15. The electrical switchgear assembly as claimed in claim 2, wherein the lateral walls of the basic module are formed by two partition walls which are configured to be latched in.

16. The electrical switchgear assembly as claimed in claim 3, wherein the lateral walls of the basic module are formed by two partition walls which are configured to be latched in.

17. The electrical switchgear assembly as claimed in claim 4, wherein the lateral walls of the basic module are formed by two partition walls which are configured to be latched in.

18. The electrical switchgear assembly as claimed in claim 2, wherein the lateral walls are configured to interact with holding grooves provided in each module bearing profile, and the lateral walls form a module housing.

19. The electrical switchgear assembly as claimed in claim 3, wherein the lateral walls are configured to interact with holding grooves provided in each module bearing profile, and the lateral walls form a module housing.

20. The electrical switchgear assembly as claimed in claim 4, wherein the lateral walls are configured to interact with holding grooves provided in each module bearing profile, and the lateral walls form a module housing.

21. The electrical switchgear assembly as claimed in claim 1, wherein
   the first end wall and the other one of the second end wall are arranged in a first direction; and
   the lateral walls are arranged in a second direction substantially orthogonal to the first direction.

22. The basic module as claimed in claim 12, wherein
   the first end wall and the other one of the second end wall are arranged in a first direction; and
   the lateral walls are arranged in a second direction substantially orthogonal to the first direction.

23. The basic module as claimed in claim 12, wherein the electrical switchgear assembly is at least one of a medium voltage switchgear assembly and a low voltage switchgear assembly.

24. The basic module as claimed in claim 12, wherein dimensions of the control and measuring units are matched to dimensions of the module.

25. The electrical switchgear assembly as claimed in claim 1, wherein the control unit is configured to perform all control functions for the basic module, and the measurement unit is configured to perform all measurement functions of the basic module.

26. The basic module as claimed in claim 12, wherein the control unit is configured to perform all control functions for the basic module, and the measurement unit is configured to perform all measurement functions of the basic module.

* * * * *